United States Patent
Kim et al.

(10) Patent No.: US 9,673,267 B2
(45) Date of Patent: Jun. 6, 2017

(54) ORGANIC LIGHT EMITTING DIODE DISPLAY DEVICE HAVING A CAPACITOR WITH STACKED STORAGE ELECTRODES AND METHOD FOR MANUFACTURING THE SAME

(71) Applicant: LG Display Co., Ltd., Seoul (KR)

(72) Inventors: Young Jun Kim, Paju-si (KR); Bo Kyoung Cho, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 30 days.

(21) Appl. No.: 14/106,791

(22) Filed: Dec. 15, 2013

(65) Prior Publication Data
US 2014/0291636 A1 Oct. 2, 2014

(30) Foreign Application Priority Data

Mar. 26, 2013 (KR) .................. 10-2013-0031852
Jul. 31, 2013 (KR) .................. 10-2013-0090778

(51) Int. Cl.
*H01L 27/12* (2006.01)
*H01L 27/32* (2006.01)

(52) U.S. Cl.
CPC ...... *H01L 27/3262* (2013.01); *H01L 27/1225* (2013.01); *H01L 27/1255* (2013.01); *H01L 27/3265* (2013.01)

(58) Field of Classification Search
CPC ............. H01L 27/3262; H01L 27/1225; H01L 27/1255; H01L 27/3265
USPC ....................................... 257/40; 438/82, 99
See application file for complete search history.

(56) References Cited

U.S. PATENT DOCUMENTS

| 8,232,986 B2 | 7/2012 | Kim et al. |
| 2004/0179161 A1 | 9/2004 | Kim et al. |
| 2007/0138478 A1 | 6/2007 | Son et al. |

(Continued)

FOREIGN PATENT DOCUMENTS

| CN | 101582235 A | 11/2009 |
| TW | 200931668 A | 7/2009 |
| TW | 200949799 A | 12/2009 |

OTHER PUBLICATIONS

Taiwan Intellectual Property Office, Office Action, Taiwanese Patent Application No. 102147281, Jun. 16, 2015, five pages [with concise explanation of relevance].

(Continued)

*Primary Examiner* — John C Ingham
*Assistant Examiner* — Didarul Mazumder
(74) *Attorney, Agent, or Firm* — Fenwick & West LLP

(57) ABSTRACT

An organic light emitting diode display device is disclosed which includes: scan, data and power lines crossing one another and arranged to define a pixel region; a switching thin film transistor disposed at an intersection of the scan and data lines; an organic light emitting diode disposed in the pixel region; a driving thin film transistor disposed between the power line and the organic light emitting diode; and a storage capacitor disposed adjacently to the organic light emitting diode and configured to charge a data signal which is applied from the data line. The storage capacitor includes a plurality of sub storage capacitors in which a plurality of storage electrodes are stacked alternately with one another.

12 Claims, 12 Drawing Sheets

(56) References Cited

U.S. PATENT DOCUMENTS

| | | | |
|---|---|---|---|
| 2008/0225061 A1* | 9/2008 | Kimura | H01L 27/1255 345/690 |
| 2009/0115950 A1* | 5/2009 | Toyota | G02F 1/136213 349/114 |
| 2009/0302319 A1 | 12/2009 | Cho et al. | |
| 2011/0108846 A1* | 5/2011 | Choi et al. | 257/72 |
| 2011/0124138 A1* | 5/2011 | Takahara | 438/34 |
| 2011/0148937 A1 | 6/2011 | Park et al. | |
| 2012/0105777 A1 | 5/2012 | Lee et al. | |
| 2012/0133855 A1 | 5/2012 | Whangbo et al. | |
| 2012/0162176 A1* | 6/2012 | Kim et al. | 345/211 |
| 2014/0252546 A1* | 9/2014 | Yen et al. | 257/532 |

OTHER PUBLICATIONS

State Intellectual Property Office of the People's Republic of China, First Office Action, Chinese Patent Application No. 2013107572026, Apr. 28, 2016, eight pages [with concise explanation of relevance].

* cited by examiner

<CIRCUIT DIAGRAM>

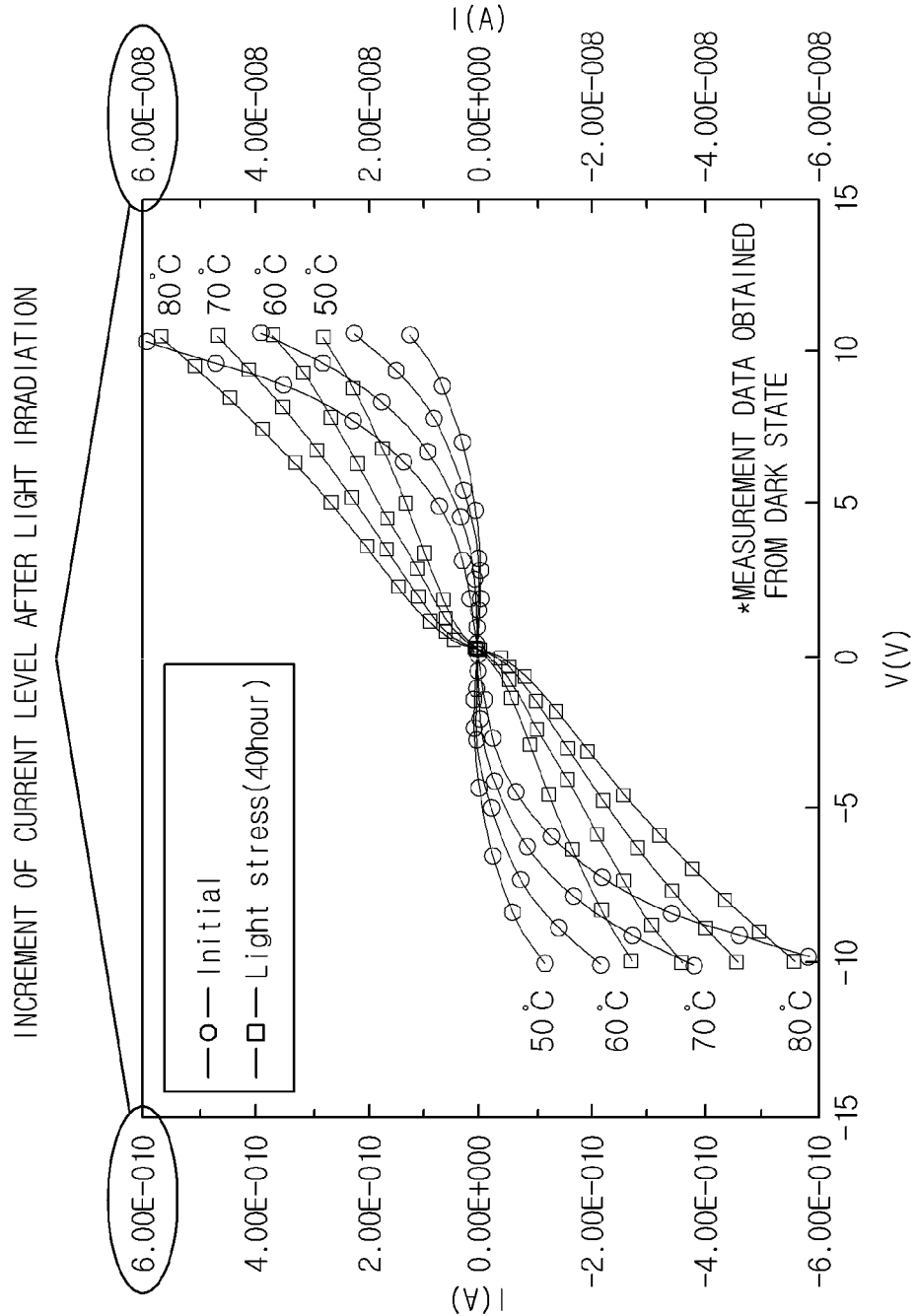

ORGANIC LIGHT EMITTING DIODE DISPLAY DEVICE HAVING A CAPACITOR WITH STACKED STORAGE ELECTRODES AND METHOD FOR MANUFACTURING THE SAME

The present application claims priority under 35 U.S.C. §119(a) of Korean Patent Application No. 10-2013-0031852 filed on Mar. 26, 2013 and Korean Patent Application No. 10-2013-0090778 filed on Jul. 31, 2013, which are hereby incorporated by reference in their entirety.

BACKGROUND

Field of the Disclosure

The present application relates to an organic light emitting diode display device and a method of manufacturing the same.

Description of the Related Art

Recently, flat panel display devices with reduced weight and volume corresponding to disadvantages of cathode ray tube (CRT) are being developed. The flat panel display devices include liquid crystal display (LCD) devices, field emission display (FED) devices, plasma display panels (PDPs), organic light emitting diode display (OLED) devices and so on.

The OLED device is a self-luminous device which uses a thin light emission layer between electrodes. As such, the OLED device can become thinner than paper. Such an OLED device emits light through a substrate and displays images. To this end, the OLED device includes an encapsulated substrate configured with a plurality of pixel regions, a cell driver array and an organic light emission array. The plurality of pixel region each includes three color (i.e., red, green and blue) sub-pixels. Also, the plurality of pixel regions is arranged in a matrix shape.

In order to realize a variety of colors, the OLED device employs organic light emission layers emitting red, green and blue light. Each of the organic light emission layers is interposed between two electrodes and forms an organic light emitting diode (OLED).

Also, the OLED device includes a plurality of data lines used to transfer video signals, a plurality of gate lines used to transfer driving signals, and a plurality of power lines used to transfer power voltages to the organic light emitting diodes. The pluralities of data lines, gate lines and power lines cross one another and define the plurality of pixel regions. Moreover, the OLED device includes a switching thin film transistor, a driving thin film transistor, a storage capacitor and the organic light emitting diode OLED which are arranged in each of the pixel regions.

The pixel regions within the OLED device must be narrowed due to recent demands for high definition and high speed response properties. As such, it is difficult for the pixel region to secure a sufficient aperture ratio. Also, the high speed response requires thin film transistors to be used in the OLED device. Moreover, in order to enhance picture (or image) quality, a high capacity storage capacitor capable of sufficiently storing a data signal (or a video signal) must be disposed within the pixel region.

However, in order to provide a high capacitance to the pixel region, the electrode area of the storage capacitor must be enlarged. As such, the aperture ratio of the pixel region is reduced contrary to this. Therefore, it is necessary to develop a technology which realizes a large capacity storage capacitor with securing a sufficient aperture ratio of the pixel region.

BRIEF SUMMARY

Accordingly, embodiments of the present application are directed to an OLED device and a manufacturing method thereof that substantially obviate one or more of problems due to the limitations and disadvantages of the related art.

The embodiments are to provide an OLED device and a manufacturing method thereof which are adapted to realize switching elements with a high speed response property by forming thin film transistors with a dual gate structure in a pixel region.

Also, the embodiments are to provide an OLED device and a manufacturing method thereof which are adapted to realize a larger storage capacitance compared to an occupation area by stacking a plurality of storage electrodes in a storage capacitor domain within a pixel region.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment, an OLED device includes: scan, data and power lines crossing one another and arranged to define a pixel region; a switching thin film transistor disposed at an intersection of the scan and data lines; an organic light emitting diode disposed in the pixel region; a driving thin film transistor disposed between the power line and the organic light emitting diode; and a storage capacitor disposed adjacently to the organic light emitting diode and configured to charge a data signal which is applied from the data line. The storage capacitor includes a plurality of sub storage capacitors in which a plurality of storage electrodes are stacked alternately with one another.

A manufacturing method of an OLED device according to another general aspect of the present embodiment includes: preparing a substrate in which an organic light emitting diode domain and a storage capacitor domain are defined; forming a first gate electrode and a storage electrode on the substrate; sequentially forming a first gate insulation film and an oxide semiconductor layer on the substrate provided with the first gate electrode; forming a channel layer on the first gate insulation film opposite to the first gate electrode, and a second storage electrode on the first gate insulation film opposite to the first storage electrode; sequentially forming a second gate insulation film and a metal film on the substrate provided with the channel layer; forming a second gate electrode on the second gate insulation film opposite to the channel layer, and a third storage electrode on the second gate insulation film opposite to the second storage electrode within the storage capacitor domain; forming an interlayer insulation film on the substrate provided with the second gate electrode; performing a contact hole formation process for the interlayer insulation film; forming source/drain electrodes electrically connected to the channel layer, and a fourth storage electrode on the interlayer insulation film opposite to the third storage electrode; forming a passivation film on the substrate provided with the source/drain electrodes; and forming a fifth storage electrode on the passivation film opposite to the fourth storage electrode.

A manufacturing method of an OLED device according to still another general aspect of the present embodiment includes: preparing a substrate in which an organic light emitting diode domain and a storage capacitor domain are defined; forming a first gate electrode and a storage electrode on the substrate; sequentially forming a first gate insulation film and an oxide semiconductor layer on the substrate provided with the first gate electrode; forming an active layer on the first gate insulation film opposite to the first gate electrode, and an active pattern on the first gate insulation film opposite to the first storage electrode; forming a second gate insulation film on the substrate provided with the active layer; forming a shield pattern on the second gate insulation film opposite to the active layer; forming a second storage electrode by performing one of a light irradiation process and a plasma treatment process for the active pattern and enhancing conductivity of the active pattern; forming a metal film on the substrate provided with the second gate insulation film; forming a second gate electrode on the second gate insulation film opposite to the active layer, and a third storage electrode on the second gate insulation film opposite to the second storage electrode within the storage capacitor domain; forming an interlayer insulation film on the substrate provided with the second gate electrode; performing a contact hole formation process for the interlayer insulation film; forming source/drain electrodes electrically connected to the active layer, and a fourth storage electrode on the interlayer insulation film opposite to the third storage electrode; forming a passivation film on the substrate provided with the source/drain electrodes; and forming a fifth storage electrode on the passivation film opposite to the fourth storage electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIGS. 10A and 10B are views illustrating a conductivity enhancement principle which is realized by irradiating light onto an oxide semiconductor layer according to another embodiment of the present disclosure;

DETAILED DESCRIPTION OF THE EMBODIMENTS

Figure 1:
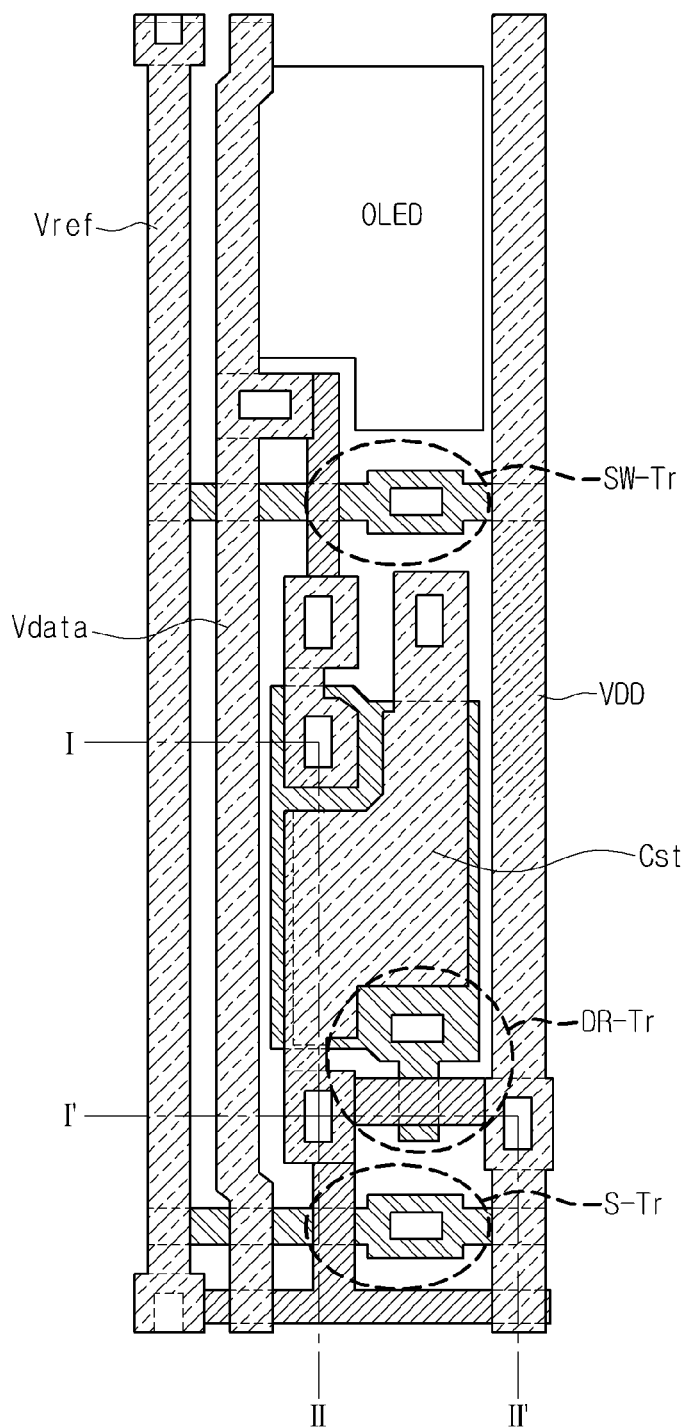
FIG. 1 is a planar view showing the pixel structure of an OLED device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
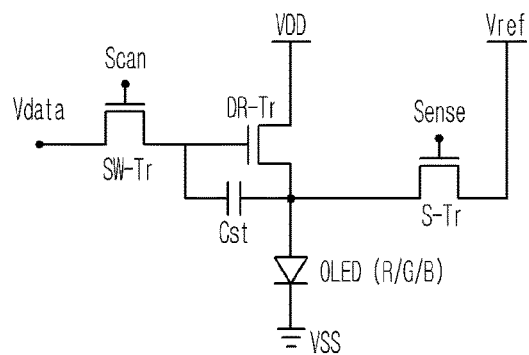
FIG. 2 is an equivalent circuit diagram showing the pixel structure of FIG. 1.

FIG. 1 is a planar view showing the pixel structure of an OLED device according to an embodiment of the present disclosure. FIG. 2 is an equivalent circuit diagram showing the pixel structure of FIG. 1.

Referring to FIGS. 1 and 2, the OLED device defines a plurality of pixel regions arranged in a matrix shape by crossing pluralities of gate lines Vdata, scan lines Scan and power lines VDD. Each of the pixel regions can emit one of red, green, blue and white lights and called as a sub-pixel. Also, the sub-pixels can be grouped by threes or fours and form color pixels.

Also, a plurality of reference voltage lines Vref can be arranged adjacently and parallel to the data lines Vdata. The reference voltage line Vref can be connected to a driving thin film transistor DR-Tr, which is disposed within the pixel region, and used to control a ground state of the driving thin film transistor DR-Tr.

A switching thin film transistor SW-Tr is disposed at an intersection domain of the scan line Scan and the data line Vdata. A sensing thin film transistor S-Tr and the driving thin film transistor DR-Tr another intersection domain of the data line Vdata and a sensing line Sense which crosses the reference voltage line Vref.

An organic light emitting diode OLED configured to emit one of red, green, blue and white lights can be disposed within the pixel region. The organic light emitting diode R/G/B/W can be controlled by the driving thin film transistor DR-Tr. Also, a storage capacitor Cst configured to charge a data signal (or a video signal) can be disposed within the pixel region. The storage capacitor Cst can be used to control the driving thin film transistor DR-Tr.

The switching thin film transistor SW-Tr is turned-on in response to a scan signal (or a gate driving signal) applied from the scan line Scan, and charges the data signal applied from the data line Vdata into the storage capacitor Cst. The driving thin film transistor DR-Tr is turned-on in response to the data signal charged in the storage capacitor Cst, and controls a current quantity which is applied from the power line VDD to the organic light emitting diode OLED.

The sensing thin film transistor S-Tr is connected a connection node between the driving thin film transistor DR-Tr and the organic light emitting diode OLED. Also, the sensing thin film transistor S-Tr can control a ground state of the driving thin film transistor DR-Tr.

N-type transistors are used as the thin film transistors DR-Tr, S-Tr and SW-Tr shown in FIGS. 1 and 2, as an example. Alternatively, P-type transistors can be used as the thin film transistors DR-Tr, S-Tr and SW-Tr of FIGS. 1 and 2.

The operation of the above-mentioned pixel of the OLED device according to the present disclosure will now be described.

If the gate driving signal (or a scan signal) is applied to the switching thin film transistor SW-Tr through one of the scan lines Scan, the switching thin film transistor SW-Tr is turned-on. Then, the data signal applied through one of the data lines Vdata is stored into the storage capacitor Cst.

When the scan signal is intercepted, the switching thin film transistor SW-Tr is turned-off. As such, the driving thin film transistor DR-Tr is turned-on in response to the data signal stored into the storage capacitor Cst.

The turned-on driving thin film transistor DR-Tr controls the quantity of a current flowing into the organic light emitting diode OLED through one of the power lines VDD. The quantity of the current flowing into the organic light emitting diode OLED is controlled according to the data signal stored in the storage capacitor Cst.

The organic light emitting diode OLED can include an anode electrode, a cathode electrode and an organic compound layers HIL, HTL, EML, ETL and EIL interposed between the two electrodes. The organic compound layers can include a hole injection layer HIL, a hole transportation layer HTL, a light emission layer EML, an electron transportation layer ETL and an electron injection layer EIL.

If a driving voltage is applied between the anode electrode and the cathode electrode, holes passing through the hole transportation layer HTL and electrons passing through the electron transportation layer ETL move into the light emission layer EML and form excitons. In accordance therewith, visible light is generated in the light emission layer EML.

Meanwhile, an aperture area of the organic light emitting diode OLED can increase and decrease according to a storage capacitor domain Cst as shown in FIG. 1. The aperture area of the organic light emitting diode OLED can become larger by narrowing the storage capacitor domain. However, the storage capacitor must be designed to have a large capacitance value, in order to sufficiently charge the data signal applied from the data line Vdata. As such, it is difficult to reduce the storage capacitor domain below a limitation because of securing a sufficient aperture ratio.

To address this matter, the present disclosure enables the storage capacitor of the OLED device to structurally include a plurality of sub storage capacitors which is formed by stacking a plurality of storage electrodes within the same occupation area. The sub storage capacitors are connected parallel to one another. As such, a total storage capacitance can become a sum of sub storage capacitances.

The structure of the storage capacitor of the present disclosure will now be described in detail through a manufacturing procedure of the OLED device which is illustrate in FIGS. 3A through 3E.

FIGS. 3A through 3E are cross-sectional views which illustrating a manufacturing method of an OLED device and taken along lines I-I' and II-II' in FIG. 1.

Referring to FIGS. 1 and 3A through 3E, the manufacturing method of the OLED device according to an embodiment of the present disclosure forms a first gate electrode 101a in a driving thin film transistor domain by forming a first metal film on a substrate 100 and performing a first mask procedure for the first metal film. At the same time, a first storage electrode 201 is formed in a storage capacitor domain within the OLED device of the present disclosure.

The first gate electrode 101a and the first storage electrode 201 can be formed from an opaque conductive material with a low resistance, such as aluminum Al, an aluminum-alloy, nickel Ni, chromium Cr, molybdenum Mo, titanium Ti, platinum Pt, tantalum Ta and so on. Alternatively, the first gate electrode 101a and the first storage electrode 201 can be formed in a multi-layered structure which is formed by stacking transparent and opaque conductive materials. The transparent conductive material can include indium-tin-oxide ITO, indium-zinc-oxide IZO and so on.

Figure 3A:
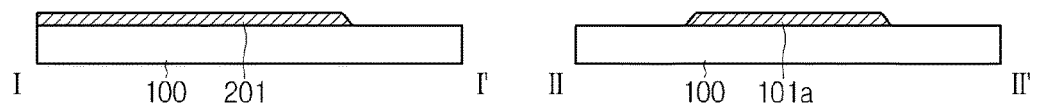
FIGS. 3A through 3E are cross-sectional views which illustrating a manufacturing method of an OLED device and taken along lines I-I' and II-II' in FIG. 1.
Figure 3B:
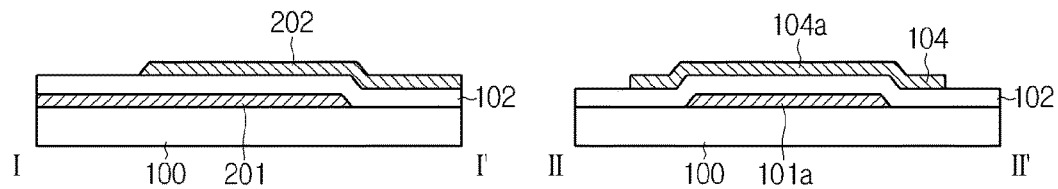

After the first gate electrode 101a and the first storage electrode 201 are formed on the substrate 100, a first gate insulation film 102 and an oxide semiconductor layer are sequentially formed on the entire surface of the substrate 100 as shown in FIG. 3B.

Subsequently, a second mask procedure is performed for the oxide semiconductor layer. In accordance therewith, a channel layer 104a is formed on the first gate insulation film 102 opposite to the first gate electrode 101a, and a second storage electrode 202 is formed on the first storage electrode 201. The second storage electrode 202 is formed from the oxide semiconductor layer.

The oxide semiconductor layer can be formed from an amorphous oxide material including at least one of indium In, zinc Zn, gallium Ga and hafnium Hf. For example, if the oxide semiconductor layer of Ga—In—Zn—O is formed through a sputtering process, either targets formed from In2O3, Ga2O3 and ZnO or a single target formed from Ga—In—Zn oxide can be used in the sputtering process. Alternatively, when the oxide semiconductor layer of Hf—In—Zn—O is formed through another sputtering process, either targets formed from HfO2, In2O3 and ZnO or a single target formed from Hf—In—Zn oxide can be used in another sputtering process.

Figure 3C:
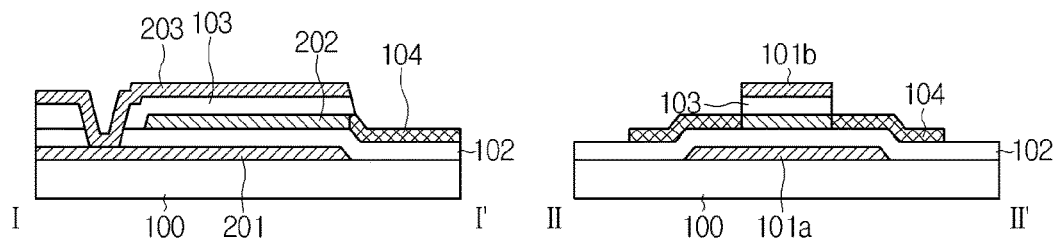

As shown in FIG. 3C, a second gate insulation film 103 and a second metal film are sequentially formed on the entire surface of the substrate 100 after the storage electrode 202 and the channel layer 104a are formed in a storage capacitor domain and a driving thin film transistor domain, respectively.

Thereafter, a third mask procedure is performed for the second metal film and the second gate insulation film 103. As such, a second gate electrode 101b is formed on the second gate insulation film 103 opposite to the channel layer 104a, and then a second gate insulation film pattern 103 is formed on the channel layer 104a. The second gate electrode 101b on the second gate insulation film 103 can be formed through a wet-etching process. The second gate insulation film pattern 103 on the channel layer 104a can be prepared through a dry-etching process.

Also, a third storage electrode 203 and another second gate insulation film pattern 103 are sequentially formed on the second storage electrode 202 within the storage capacitor domain when the wet-etching process and the dry-etching process are continuously performed for the second metal film and the second gate insulation film 103. The third storage electrode 203 comes in electrical contact with the first storage electrode 201, which is formed on the substrate 100, through a contact hole.

The second metal film used in the formation of the second gate electrode 101b and the third storage electrode 203 can be formed from the same material as the first metal film which had been used in the formation of the first gate electrode 101a.

Also, the channel layer 104 is partially exposed to a plasma gas which is used in the dry-etching process for patterning the second gate insulation film 103, thereby causing an oxygen shortcoming phenomenon. As such, the channel layer 104a is partially changed into conductive semiconductor patterns 104.

In detail, as shown in the drawing, both side portions of the channel layer 104a exposed by the second gate electrode 101b are exposed to the plasma gas during the dry-etching process and changed into the conductive semiconductor patterns 104. Also, another portion of the channel layer 104a not covered with the third storage electrode 203 within the storage capacitor domain is exposed to the plasma gas during the dry-etching process and changed into the conductive semiconductor pattern 104.

As such, a part of the second storage electrode 202 in an overlapping region with the third storage electrode 203 is formed from the oxide semiconductor layer, but the rest of the channel layer in a non-overlapping region with the third storage electrode 203 is formed from the conductive semiconductor pattern 104.

Figure 3D:
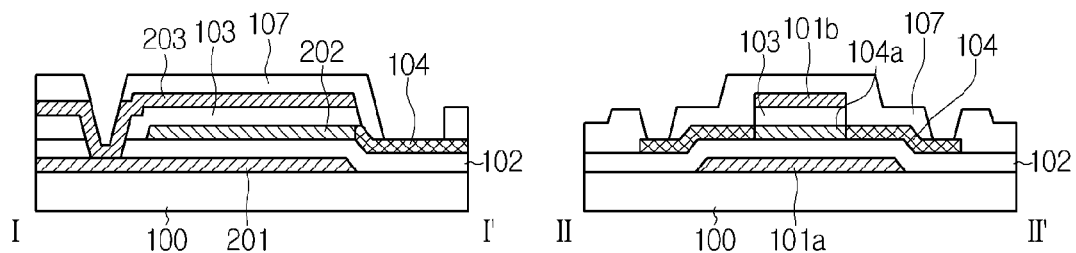

After the second gate electrode 101b and the third storage electrode 203 are formed on the second gate insulation film 103, an interlayer insulation film 107 is formed on the entire surface of the substrate 100 as shown in FIG. 3D. Subsequently, a contact hole formation process is performed for the interlayer insulation film 107 in order to expose the conductive semiconductor patterns 104 which correspond to both side edges of the channel layer 104a opposite to outer regions of the second gate electrode 101b.

The contact hole formation process forms other contact holes within the storage capacitor domain. The contact holes within the storage capacitor domain expose apart of the third storage electrode 203 and a part of the conductive semiconductor pattern 104 which is formed in a single body united with the second storage electrode 202.

Figure 3E:
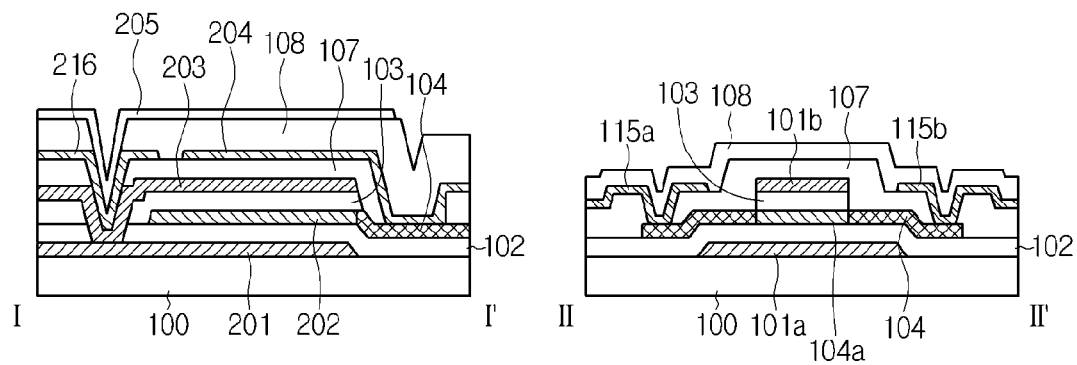

Afterward, a source/drain metal film is formed on the entire surface of the substrate 100 and a fourth mask procedure is performed for the source/drain metal film. In accordance therewith, source/drain electrodes 115a and 115b being in contact with the conductive semiconductor patterns 104 exposed by the second gate electrode 101b are formed as shown in FIG. 3E.

The source/drain metal film can be formed from any one of molybdenum Mo, titanium Ti, tantalum Ta, tungsten W, copper Cu, chromium Cr, aluminum Al and alloys thereof.

Also, a fourth storage electrode 204 overlapping with the third storage electrode 203 is formed on the interlayer insulation film 107 within the storage capacitor domain. The fourth storage electrode 204 is simultaneously formed with the source/drain electrodes 115a and 115b.

The fourth storage electrode 204 is formed in a single body united with the second storage electrode 202. Such a fourth storage electrode 204 comes in electrical contact with the conductive semiconductor pattern 104 which is exposed by partially removing the interlayer insulation film 107.

Moreover, a connection pattern 216 being electrically separated from the fourth storage electrode 204 is formed. The connection pattern 216 comes in electrical contact with the exposed third storage electrode 203. Such a connection pattern 216 is used for electrically connecting the third storage electrode 203 with a fifth storage electrode 205 which will be formed later. Similarly to the fourth storage electrode 204, the connection pattern 216 is simultaneously formed with the source/drain electrodes 115a and 115b.

After the fourth storage electrode 204 and the source/drain electrodes 115a and 115b are formed on the substrate 100, a passivation film 108 is formed on the entire surface of the substrate 100. Also another contact hole formation process for exposing a part of the connection pattern 216 is performed for the passivation film 108.

Thereafter, the fifth storage electrode 205 is simultaneously formed on the passivation film 108 opposite to the fourth storage electrode 204 when an electrode (one of anode and cathode electrodes) of an organic light emitting diode OLED is formed. The fifth storage electrode 205 is electrically connected to the connection pattern 216.

In this manner, the storage capacitor Cst of the OLED device according to the present disclosure can be formed in such a manner that the first, third and fifth storage electrodes 201, 203 and 205 connected to one another overlap alternately with the second and fourth storage electrodes 202 and 204 connected to each other. As such, the storage capacitor Cst is configured with four sub storage capacitors (C1 through C4 in FIG. 5) connected parallel to one another.

Figure 5:
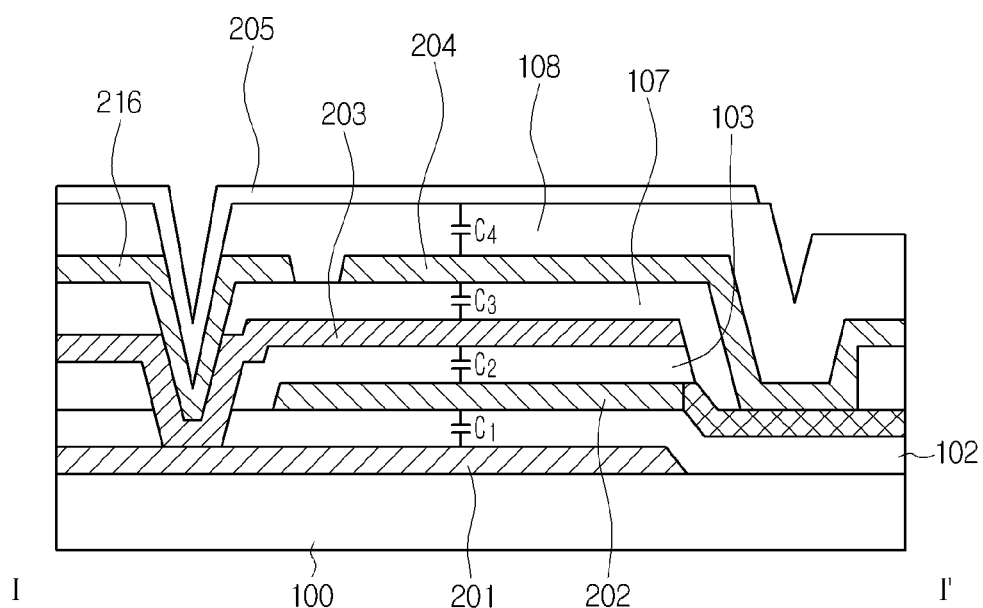
FIG. 5 is a cross-sectional view showing a parallel structure of a storage capacitor domain within the OLED device according to an embodiment of the present disclosure.

Such a connection structure of the sub storage capacitors shown in FIG. 5 allows first through fourth sub storage capacitors C1 through C4 to be stacked in such a manner as to overlap with one another in a perpendicular direction. However, the first through fourth sub storage capacitors C1 through C4 are connected parallel to one another. As such, the total capacitance value of the storage capacitor within the OLED device of the present disclosure can be set to have the sum of capacitance values of the first through fourth sub storage capacitors C1 through C4.

Although the storage capacitor domain of the present disclosure is defined in the same area as that of the related art, the storage capacitor Cst of the present disclosure can obtain a large storage capacitance corresponding to the sum of four sub storage capacitors. In accordance therewith, a charge property of the data signal can be enhanced.

Moreover, the OLED device of the present disclosure can obtain a large storage capacitance value using a storage capacitor domain no more than that of the related art. As such, the OLED device of the present disclosure can enhance the aperture ratio of the organic light emitting diode OLED.

Figure 4A:
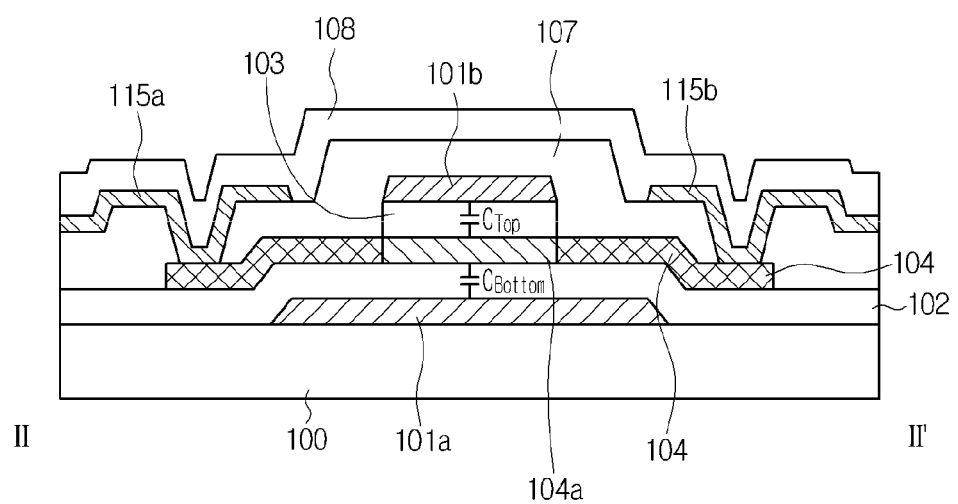
FIG. 4A is a cross-sectional view illustrating the connection structure of capacitors within a thin film transistor of a dual gate electrode structure which is used to the OLED device according to an embodiment of the present disclosure.
Figure 4B:
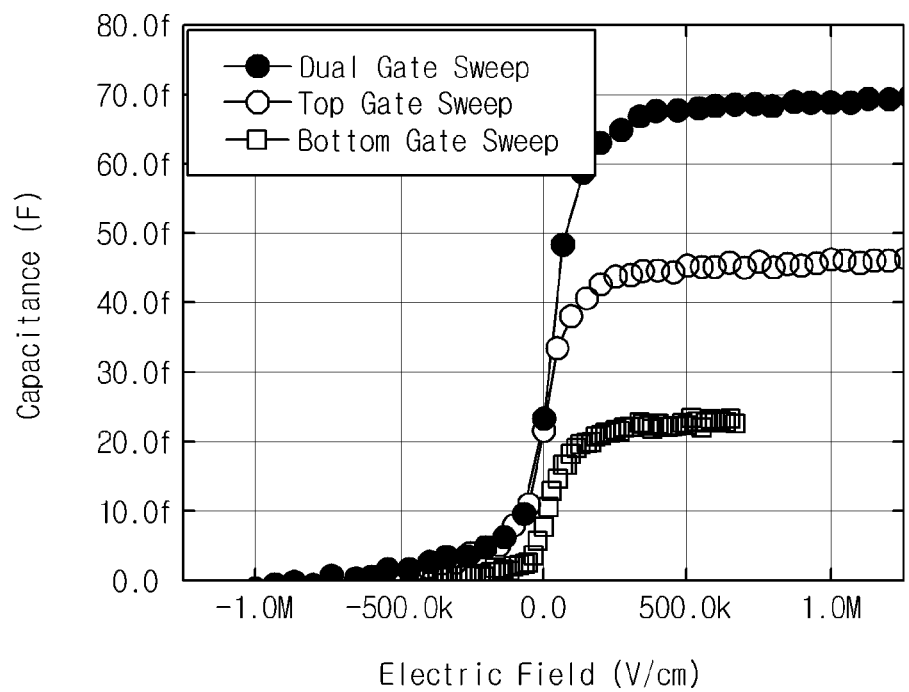
FIG. 4B is a data sheet comparison-illustrating capacitive properties of dual gate, top gate and bottom thin film transistors with respect to an electric field.

FIG. 4A is a cross-sectional view illustrating the connection structure of capacitors within a thin film transistor of a dual gate electrode structure which is used to the OLED device according to an embodiment of the present disclosure. FIG. 4B is a data sheet comparison-illustrating capacitive properties of dual gate, top gate and bottom thin film transistors with respect to an electric field.

Referring to FIGS. 4A and 4B, the OLED device of the present disclosure includes a thin film transistor with a dual gate structure. The thin film transistor with the dual gate structure includes a bottom capacitor C_bottom and a top capacitor C_top which are formed in a gate electrode region. The bottom capacitor C_bottom is formed between the first gate electrode 101a and the channel layer 104a. The top capacitor C_top is formed between the second gate electrode 101b and the channel layer 104a.

However, the conductive semiconductor patterns 104 not overlapping with the second gate electrode 101b and the channel layer 104a of the oxide semiconductor layer between the conductive semiconductor patterns 104 can cause a problem. As such, it is necessary to ascertain whether capacitances are formed between the channel layer 104a and the first and second gate electrodes 101a and 101b.

As seen from FIG. 4B, it is evident that the bottom and top capacitors C_bottom and C_top have capacitance values of about 20.0 F and 45.0 F, respectively.

Also, the total capacitance of the gate electrode region within the driving thin film transistor DR_Tr is 70.0 F. In other words, it is evident that the total capacitance of the gate electrode region corresponds to the sum of the bottom and top capacitors C_bottom and C_top.

As such, it is evident that capacitors are formed between the channel layer 104a and the gate electrodes 101a and 101b within the thin film transistor.

Although the OLED device allows the metal material electrodes and the channel layer of the oxide semiconductor layer to be stacked alternately with one another, it is evident that storage capacitances are formed between them.

FIG. 5 is a cross-sectional view showing a parallel structure of a storage capacitor domain within the OLED device according to an embodiment of the present disclosure.

Referring to FIG. 5, the OLED device of the present disclosure provides a storage capacitor domain within the pixel region. As shown in FIG. 3E, the storage capacitor Cst has a structure of including the first through fifth storage electrodes 201 through 205 which are sequentially stacked on the substrate 100.

The first and second gate insulation films 102 and 103, the interlayer insulation film 107 and the passivation film 108 are disposed between the first through fifth storage electrodes 201 through 205.

In accordance therewith, a first sub storage capacitor C1 is formed between the first and second storage electrodes 201 and 202. Also, a second sub storage capacitor C2 is formed between the second and third storage electrodes 202 and 203. Moreover, a third sub storage capacitor C3 is formed between the third and fourth storage electrodes 203 and 204. Furthermore, a fourth sub storage capacitor C4 is formed between the fourth and fifth storage electrodes 204 and 205.

As explained in FIGS. 4A and 4B, the first through fourth sub storage capacitors C1 through C4 are connected parallel to one another. As such, the storage capacitance Cst of the OLED device according to the present disclosure can become the sum of the first through fourth sub storage capacitors C1 through C4. Moreover, although the second storage electrode 202 is the channel layer formed from the oxide semiconductor, the second storage electrode 202 together with the conductive semiconductor pattern 104 can have a metallic property and be used as an electrode.

$$\text{Storage capacitor } Cst = 1st \text{ sub storage capacitor} \\ C1 + 2nd \text{ sub storage capacitor } C2 + 3rd \text{ sub storage capacitor } C3 + 4th \text{ sub storage capacitor } C4 \quad \text{[Equation 1]}$$

In other words, the storage capacitor Cst can be defined by the above-mentioned equation 1.

As such, the OLED device of the present disclosure can obtain a large storage capacitance value using a storage capacitor domain no more than that of the related art. Also, the OLED device of the present disclosure can obtain a desired storage capacitance value using a storage capacitor domain no more than that of the related art Moreover, although the storage capacitor domain of the OLED device according to the present disclosure is defined narrower than that of the related art, a large storage capacitor Cst can be obtained. In accordance therewith, the organic light emitting diode domain can expand. In other words, the aperture ratio of the pixel region can become larger.

FIGS. 6A through 6F are cross-sectional views illustrating a manufacturing method of an OLED device according to another embodiment of the present disclosure.

The OLED device according to another embodiment of the present disclosure has the same planar structure as the pixel shown in FIG. 1. As such, a storage capacitor domain shown in FIGS. 6A through 6F corresponds to a portion taken along a line I-I' in FIG. 1, and a thin film transistor domain shown in FIGS. 6A through 6F corresponds to another portion taken along another line II-II' in FIG. 1.

For the convenience of explanation, the manufacturing method of the OLED device according to another embodiment of the present disclosure will now be described together with the planar structure of the pixel shown in FIG. 1.

Referring to FIGS. 1 and 6A through 6F, the manufacturing method of the OLED device according to another embodiment of the present disclosure forms a first gate electrode 301a in a driving thin film transistor domain by forming a first metal film on a substrate 300 and performing a first mask procedure for the first metal film. At the same time, a first storage electrode 401 is formed in a storage capacitor domain within the OLED device of the present disclosure.

The first gate electrode 301a and the first storage electrode 401 can be formed from an opaque conductive material with a low resistance, such as aluminum Al, an aluminum-alloy, tungsten W, copper Cu, nickel Ni, chromium Cr, molybdenum Mo, titanium Ti, platinum Pt, tantalum Ta and so on. Alternatively, the first gate electrode 301a and the first storage electrode 401 can be formed in a multi-layered structure which is formed by stacking transparent and opaque conductive materials. The transparent conductive material can include indium-tin-oxide ITO, indium-zinc-oxide IZO and so on.

Figure 6A:
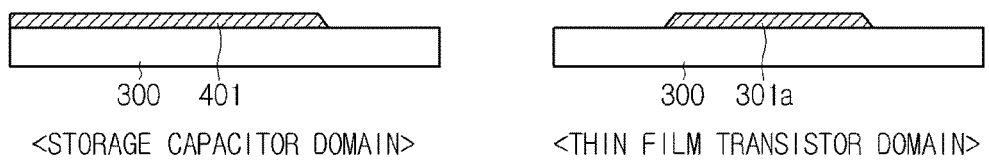
FIGS. 6A through 6F are cross-sectional views illustrating a manufacturing method of an OLED device according to another embodiment of the present disclosure.
Figure 6B:
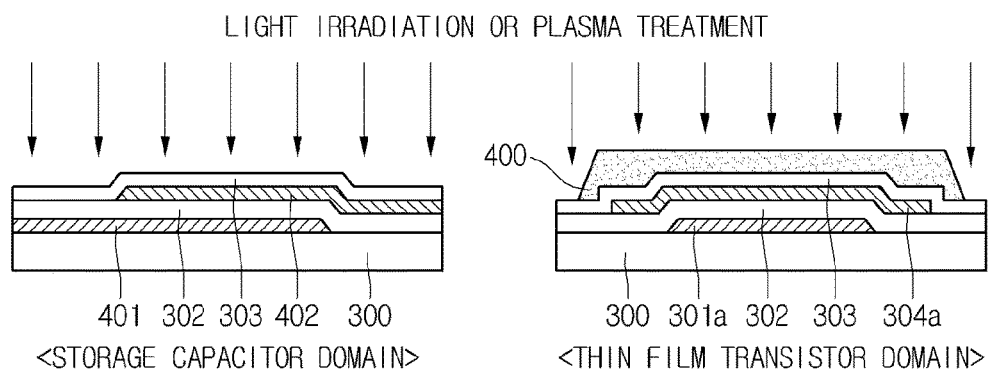
Figure 6C:
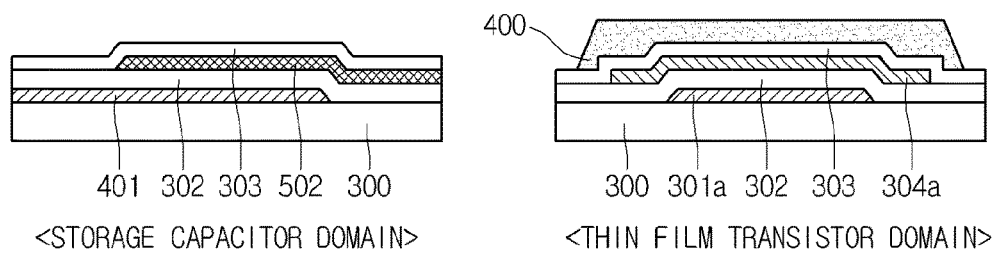

After the first gate electrode 301a and the first storage electrode 401 are formed on the substrate 300, a first gate insulation film 302 and an oxide semiconductor layer are sequentially formed on the entire surface of the substrate 300 as shown in FIGS. 6B and 6C.

Subsequently, a second mask procedure is performed for the oxide semiconductor layer. In accordance therewith, an active layer 304a is formed on the first gate insulation film 302 opposite to the first gate electrode 301a, and an oxide semiconductor pattern 402 is formed on the first storage electrode 401.

The oxide semiconductor layer can be formed from an amorphous oxide material including at least one of indium In, zinc Zn, gallium Ga and hafnium Hf. For example, if the oxide semiconductor layer of Ga—In—Zn—O is formed through a sputtering process, either multiple targets formed from In2O3, Ga2O3 and ZnO or a single target formed from Ga—In—Zn oxide can be used in the sputtering process. Alternatively, when the oxide semiconductor layer of Hf—In—Zn—O is formed through another sputtering process, either multiple targets formed from HfO2, In2O3 and ZnO or a single target formed from Hf—In—Zn oxide can be used in another sputtering process.

A second gate insulation film 303 is formed on the entire surface of the substrate 300 after the oxide semiconductor pattern 402 and the active layer 304a are formed in a storage capacitor domain and a driving thin film transistor domain, respectively.

Afterward, a shield pattern 600 is formed on the second gate insulation film 303, and one of an ultra-violet ray irradiation process and a plasma treatment process is performed for the entire surface of the substrate 300 provided with the shield pattern 600. The shield pattern 600 allows the active layer 304a thereunder to be exposed to ultra-violet rays or plasma gases. Such a shield pattern 600 can be formed from a photosensitive film.

Although the ultra-violet ray irradiation process or the plasma treatment process is performed for the surface of the substrate 300, the active layer 304a covered with the shield pattern 600 is not affected with the ultra-violet rays or the plasma gases because the ultra-violet rays or the plasma gases are intercepted by the shield pattern 600. Meanwhile, the oxide semiconductor pattern formed on the first storage electrode 401 is exposed to the ultra-violet rays or the plasma gases and changed into a second storage electrode 502 with superior conductivity.

A principle of enhancing the conductivity of the second storage electrode 502 through the ultra-violet ray irradiation process or the plasma treatment process will be explained in detail through the descriptions of FIGS. 8A, 8B, 10A and 10B, later.

The shield pattern 600 is removed from the second gate insulation film 303 after the formation of the second storage electrode 502.

The metallized second storage electrode 502 can have a superior conductive property compared to the second storage electrode formed from the oxide semiconductor material. As such, the metallized second storage electrode 502 can increase the capacitance of the storage capacitor. Therefore, the storage capacitor can stably secure a desired capacitance.

Figure 6D:
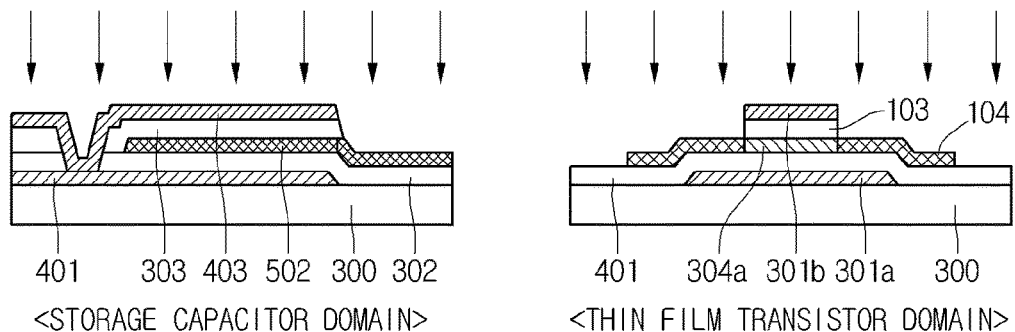

After the formation of the second storage electrode 502, a second metal film is formed on the entire surface of the substrate 300 as shown in FIG. 6D. Subsequently, a third mask procedure is performed for the second metal film and the second gate insulation film 303. As such, a second gate electrode 301b is formed on the second gate insulation film 303 opposite to the active layer 304a, and then a second gate insulation film pattern 303 is formed on the active layer 304a. The second gate electrode 301b on the second gate insulation film 303 can be formed through a wet-etching process. The second gate insulation film pattern 303 on the active layer 304a can be patterned through a dry-etching process. The wet-etching process and the dry-etching process can be continuously performed.

Also, both side edges of the active layer 304a is metallized by a plasma gas, which is used in the dry-etching process for patterning the second gate insulation film 303, because the second gate electrode 301b overlaps with the central portion of the active layer 204a. In other words, as shown in the drawing, both side portions of the active layer 304a exposed by the second gate electrode 301b are exposed to the plasma gas during the dry-etching process, which is performed after the wet-etching process, and changed into the conductive portions 304.

Moreover, a third storage electrode 403 overlapping with the second storage electrode 502 is formed within the storage capacitor domain because the second metal film and the second gate insulation film 303 covering the second storage electrode 502 are sequentially etched through the wet-etching process and the dry-etching process. The third storage electrode 403 comes in electrical contact with the first storage electrode 401 formed on the substrate 300 through a contact hole.

The second metal film used in the formation of the second gate electrode 301b and the third storage electrode 403 can be formed from the same metal as the first metal film which is used in the formation of the first gate electrode 301a.

Figure 6E:
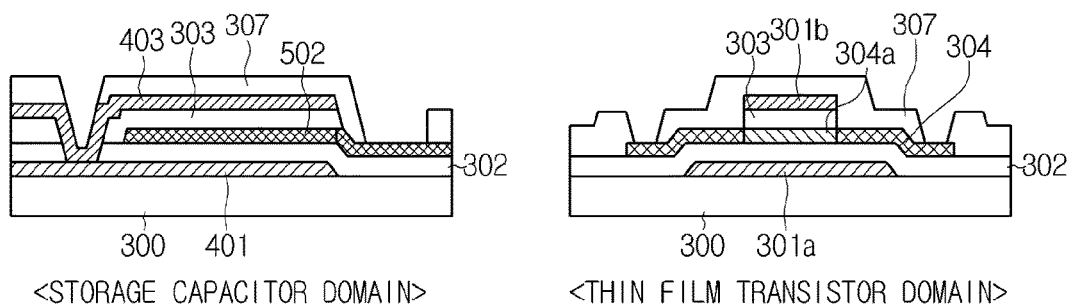

After the second gate electrode 301b and the third storage electrode 403 are formed on the second gate insulation film 303, an interlayer insulation film 307 is formed on the entire surface of the substrate 300 as shown in FIG. 6E. Subsequently, a contact hole formation process is performed for the interlayer insulation film 307 in order to expose the conductive portions 304 which correspond to both side edges of the active layer 304a opposite to outer regions of the second gate electrode 301b.

The contact hole formation process forms other contact holes within the storage capacitor domain. The contact holes within the storage capacitor domain expose a part of the third storage electrode 403 and a part of an expanded portion which is formed in a single body united with the second storage electrode 502.

Figure 6F:
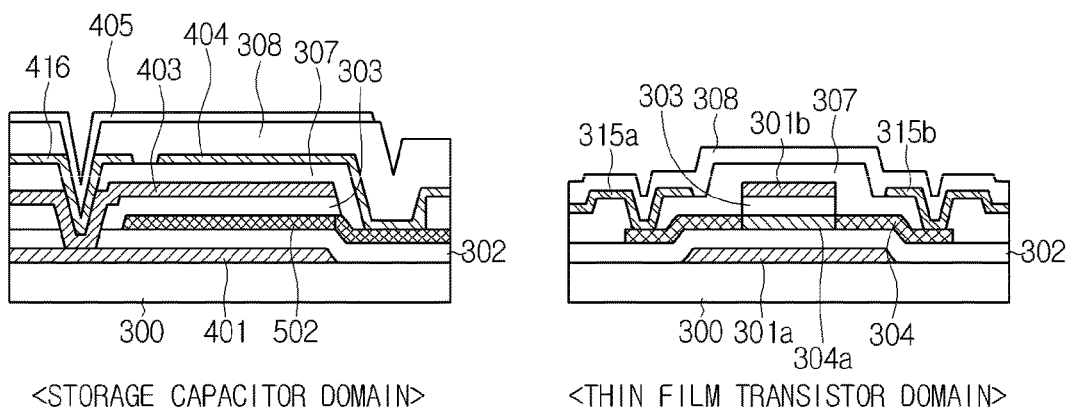

Afterward, a source/drain metal film is formed on the entire surface of the substrate 300 and a fourth mask procedure is performed for the source/drain metal film. In accordance therewith, source/drain electrodes 315a and 315b being in contact with the conductive portions 304 of the active layer 304a exposed by the second gate electrode 301b are formed as shown in FIG. 6F.

The source/drain metal film can be formed from any one of molybdenum Mo, titanium Ti, tantalum Ta, tungsten W, copper Cu, chromium Cr, aluminum Al and alloys thereof.

Also, a fourth storage electrode 404 overlapping with the third storage electrode 403 is formed on the interlayer insulation film 307 within the storage capacitor domain. The fourth storage electrode 404 is simultaneously formed with the source/drain electrodes 315a and 315b.

Such a fourth storage electrode 404 comes in electrical contact with the expanded portion of the second storage electrode 502 which is exposed by partially removing the interlayer insulation film 307. In other words, the fourth storage electrode 404 is electrically connected to the second storage electrode 502 through a contact hole.

Moreover, a connection pattern 416 being electrically separated from the fourth storage electrode 404 is formed. The connection pattern 416 comes in electrical contact with the exposed third storage electrode 403. Such a connection pattern 416 is used for electrically connecting the third storage electrode 403 with a fifth storage electrode 405 which will be formed later. Similarly to the fourth storage electrode 404, the connection pattern 416 is simultaneously formed with the source/drain electrodes 315a and 315b.

After the fourth storage electrode 404 and the source/drain electrodes 315a and 315b are formed on the substrate 300, a passivation film 308 is formed on the entire surface of the substrate 300. Also another contact hole formation process for exposing a part of the connection pattern 416 is performed for the passivation film 308.

Subsequently, the fifth storage electrode 405 is simultaneously formed on the passivation film 308 opposite to the fourth storage electrode 404 when an electrode (one of anode and cathode electrodes) of an organic light emitting diode OLED is formed. The fifth storage electrode 405 is electrically connected to the connection pattern 416.

In this way, the storage capacitor Cst of the OLED device according to the present disclosure can be formed in such a manner that the first, third and fifth storage electrodes 401, 403 and 405 connected to one another overlap alternately with the second and fourth storage electrodes 502 and 404 connected to each other. As such, the storage capacitor Cst is configured with four sub storage capacitors (C1 through C4 in FIG. 5) connected parallel to one another.

Figure 12:
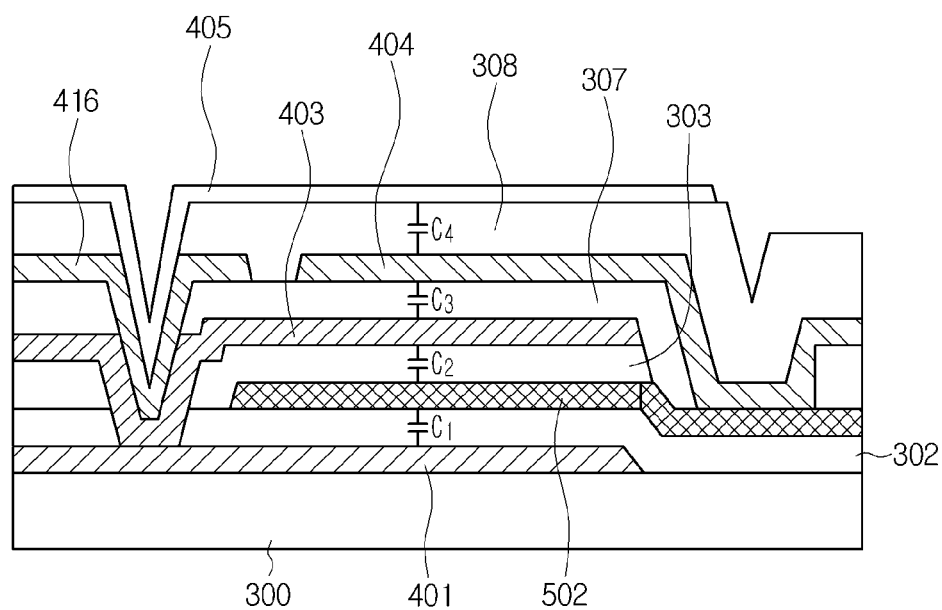
FIG. 12 is a cross-sectional view showing a parallel structure of a storage capacitor domain within the OLED device according to another embodiment of the present disclosure.

Such a connection structure of the sub storage capacitors allows first through fourth sub storage capacitors C1 through C4 to be stacked in such a manner as to overlap with one another in a perpendicular direction, as shown in FIG. 12. However, the first through fourth sub storage capacitors C1 through C4 are connected parallel to one another. As such, the total capacitance value of the storage capacitor Cst within the OLED device of the present disclosure can be set to have the sum of capacitance values of the first through fourth sub storage capacitors C1 through C4.

Although the storage capacitor domain of the present disclosure is defined in the same area as that of the related art, the storage capacitor Cst of the present disclosure can obtain a large storage capacitance corresponding to the sum of four sub storage capacitors. In accordance therewith, a charge property of the data signal can be enhanced.

Moreover, the OLED device of the present disclosure can obtain a large storage capacitance value using a storage capacitor domain no more than that of the related art. As such, the OLED device of the present disclosure can enhance the aperture ratio of the organic light emitting diode domain.

Furthermore, the OLED device of the present disclosure performs the light irradiation process or the plasma treatment process for the oxide semiconductor pattern, which is used to form an electrode of the storage capacitor, enhances conductivity of the electrode. Therefore, the storage capacitor can stably secure a desired capacitance.

Figure 7:
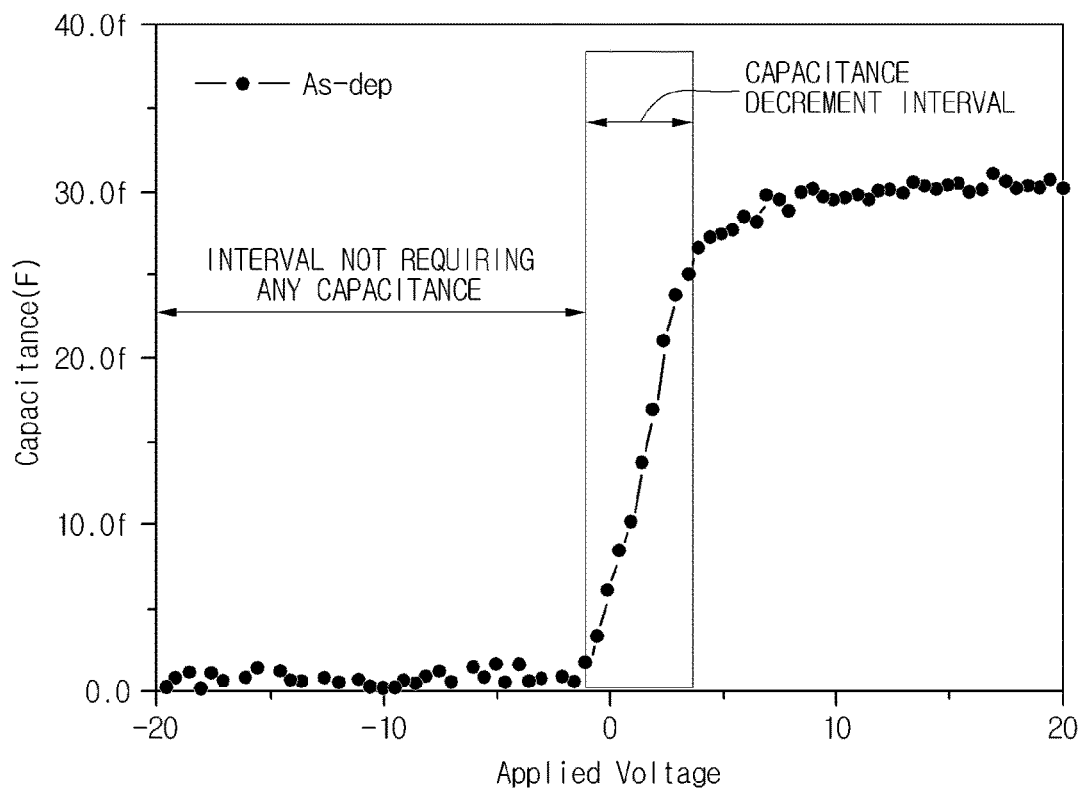
FIG. 7 is a data sheet illustrating a capacitive property of an ordinary thin film transistor which uses an oxide semiconductor layer as a capacitor electrode.

FIG. 7 is a data sheet illustrating a capacitive property of an ordinary thin film transistor which uses an oxide semiconductor layer as a capacitor electrode. As shown in FIG. 7, the capacitor using the oxide semiconductor as an electrode has lower conductivity when a low voltage is applied. As such, the electrode formed from the oxide semiconductor deteriorates the property of the capacitor.

When the OLED device is not driven, there is not any problem because a capacitance is unnecessary. However, the capacitance of the storage capacitor can be normally generated by a high voltage of at least 5V which is applied during a driving interval. Meanwhile, the capacitance of the storage capacitor decreases in a low voltage interval of about 0-5V.

In other words, the storage capacitor configured with electrodes formed from the oxide semiconductor within the pixel region has a conductive property, but the conductive property deteriorates in the low voltage interval. Due to this, the property of the storage capacitor must deteriorate.

On the other hand, the present disclosure performs the light irradiation process or the plasma treatment process for the storage electrode formed from the oxide semiconductor, and enhances conductivity of the storage electrode. Therefore, the storage capacitor can have an enhanced property.

Figure 8A:
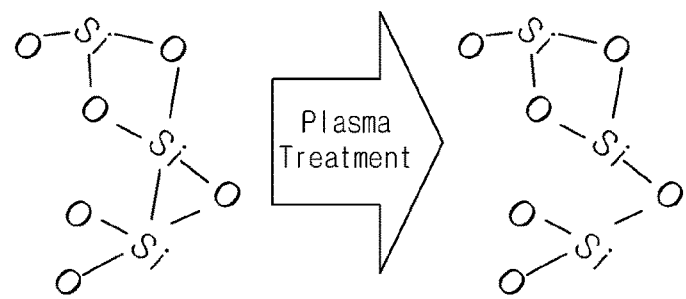
FIGS. 8A and 8B are views illustrating a conductivity enhancement principle which is realized by plasma-treating an oxide semiconductor layer according to another embodiment of the present disclosure.
Figure 8B:
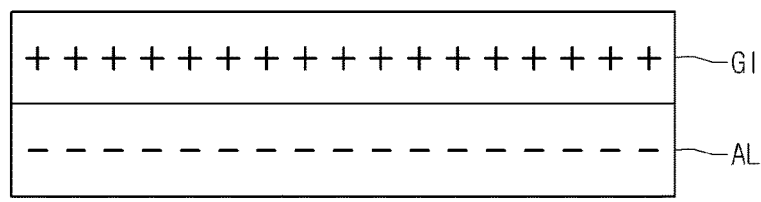
Figure 9:
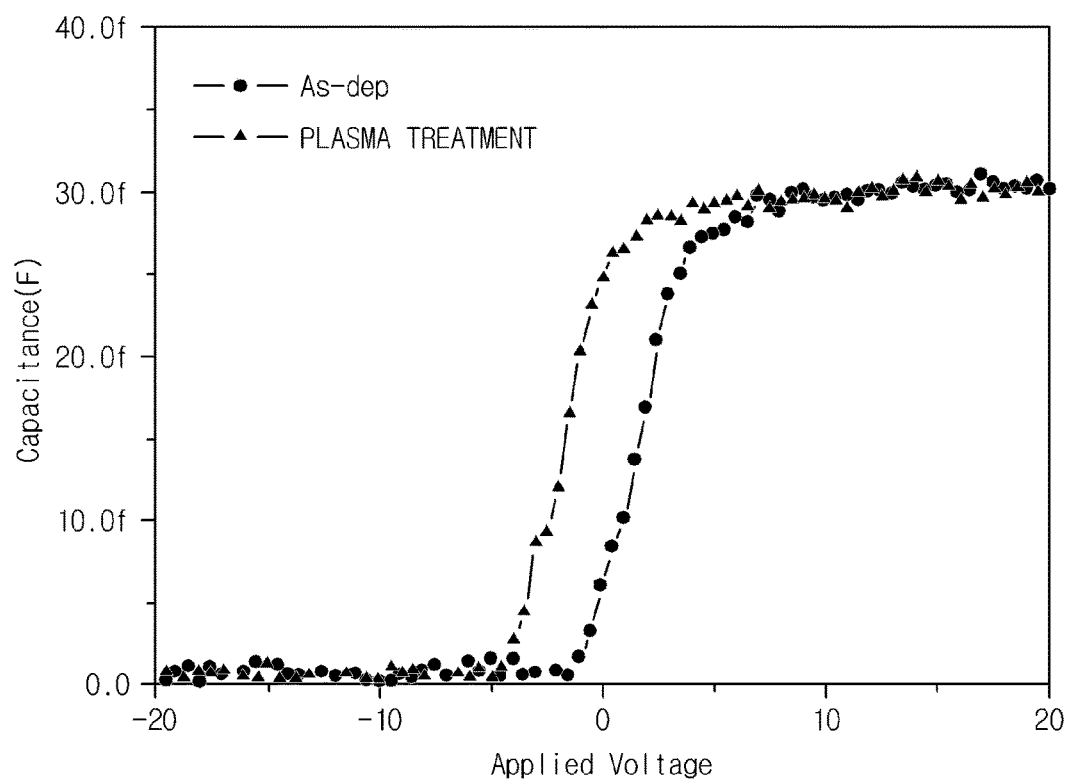
FIG. 9 is a data sheet comparison-illustrating capacitive properties of thin film transistors with a plasma-treated oxide semiconductor layer in accordance with another embodiment of the present disclosure and an ordinary oxide semiconductor layer.

FIGS. 8A and 8B are views illustrating a conductivity enhancement principle which is realized by plasma-treating an oxide semiconductor layer according to another embodiment of the present disclosure. FIG. 9 is a data sheet comparison-illustrating capacitive properties of thin film transistors with a plasma-treated oxide semiconductor layer in accordance with another embodiment of the present disclosure and an ordinary oxide semiconductor layer.

As shown in FIGS. 8A, 8B and 9, an active layer AL is formed from an oxide semiconductor and a gate insulation film GL is formed on the active layer AL. If the gate insulation film GL is exposed to a plasma gas, a combination state of silicon atoms is changed and then internal charge states of the gate insulation film GL and the active layer AL are changed, due to collisions between atoms. In general, the plasma gas enables positive charges to be generated in the gate insulation film GL. As such, an internal electric field is generated between the gate insulation film GL and the active layer AL, as shown in FIG. 8B.

The internal electric field enhances conductivity of the active layer AL. As such, the plasma-treated active layer AL can have a superior conductive property compared to an ordinary active layer formed from the oxide semiconductor.

As seen from FIG. 9, it is evident that the plasma-treated oxide semiconductor layer enhances a conductive property in the low voltage interval of about 0-5V, unlike an ordinary oxide semiconductor layer As-dep. In other words, the plasma treatment can shift the property of a capacitor with the ordinary oxide semiconductor electrode in the left direction. Therefore, the capacitive property of the storage capacitor in the low voltage interval can be enhanced using the plasma treatment.

Figure 10A:
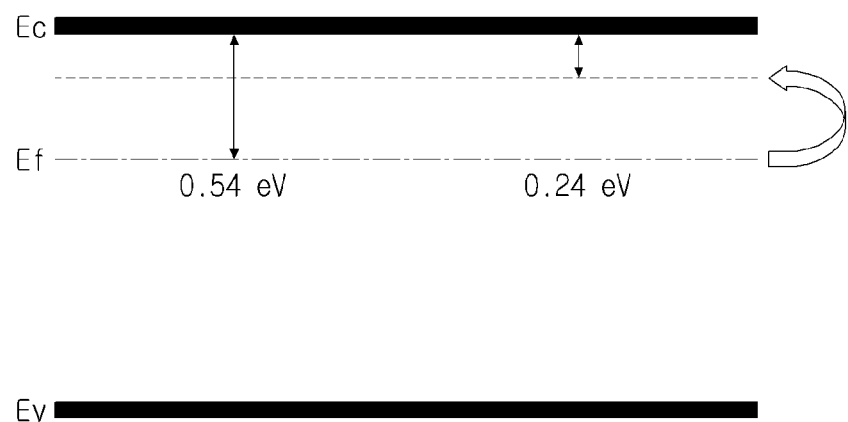
Figure 11:
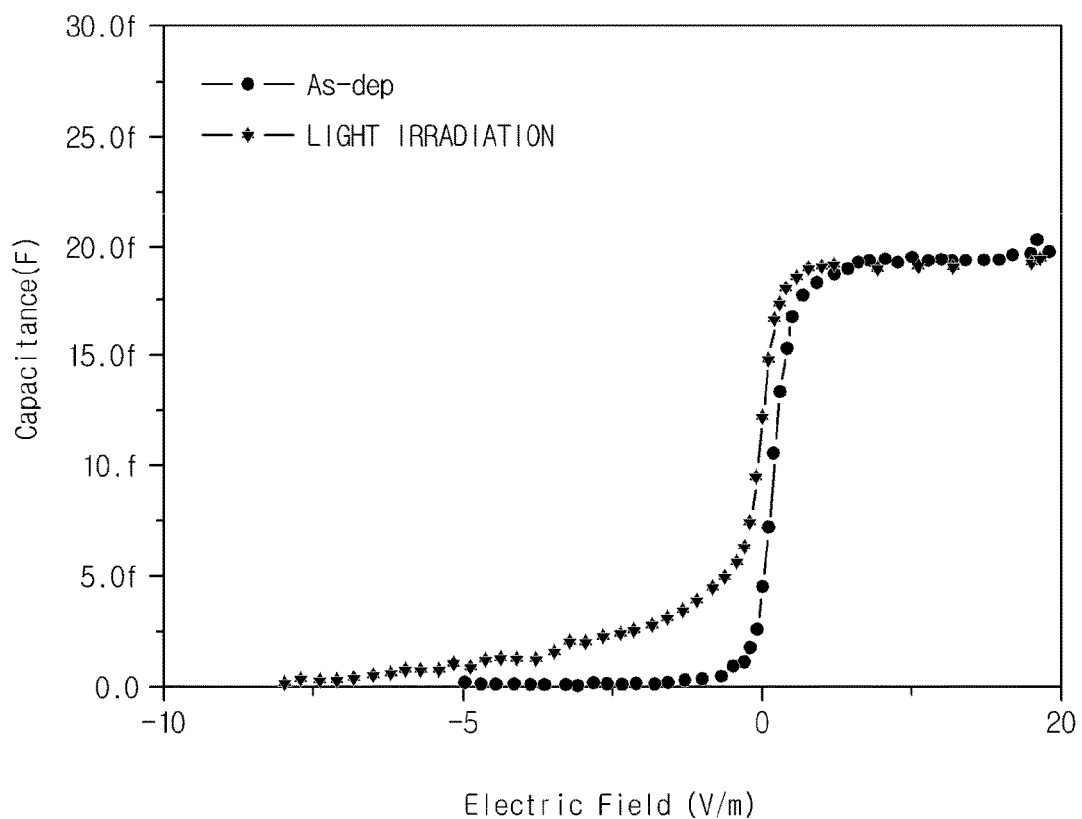
FIG. 11 is a data sheet comparison-illustrating capacitive properties of thin film transistors with a light-irradiated oxide semiconductor layer in accordance with another embodiment of the present disclosure and an ordinary oxide semiconductor layer.

FIGS. 10A and 10B are views illustrating a conductivity enhancement principle which is realized by irradiating light onto an oxide semiconductor layer according to another embodiment of the present disclosure. FIG. 11 is a data sheet comparison-illustrating capacitive properties of thin film transistors with a light-irradiated oxide semiconductor layer in accordance with another embodiment of the present disclosure and an ordinary oxide semiconductor layer.

Referring to FIGS. 10A, 10B and 11, when light is irradiated onto an oxide semiconductor, a vacancy is generated within the oxide semiconductor and the density of carriers becomes higher.

As such, a Fermi level Ef is moved toward to a conduction band based on a valence band. In accordance therewith, the current property of the light-irradiated oxide semiconductor enhances.

As shown in the drawings, an energy gap between the Fermi level and the conduction band in the initial oxide semiconductor is about 0.54 eV, but the energy gap between the Fermi level Ef and the conduction band Ec in the light-irradiated oxide semiconductor becomes about 0.24 eV.

FIG. 10B illustrates current properties of the light-irradiated oxide semiconductor and the initial oxide semiconductor which are measured at temperatures of 50° C., 60° C., 70° C. and 80t in a dark state shielded from light. As seen from FIG. 10B, it is evident that the light-irradiated oxide semiconductor ("□") can have a larger current quantity compared to the initial oxide semiconductor ("○") which is not exposed to light.

The light-irradiated oxide semiconductor can have an enhanced conductivity. As such, the oxide semiconductor layer of the thin film transistor interposed between the first gate electrode and the second gate electrode can be used as a storage electrode.

In this case, the first and second gate electrodes of the thin film transistor can be connected parallel to each other based on the storage capacitor electrode with the superior conductivity. Therefore, the capacitance of the thin film transistor with the oxide semiconductor layer can increase.

As seen from FIG. 11, it is evident that the capacitance ("★") of the thin film transistor with the light-irradiated oxide semiconductor layer becomes larger than that ("●") of the ordinary thin film transistor with the initial (or normal) oxide semiconductor layer not exposed to light.

FIG. 12 is a cross-sectional view showing a parallel structure of a storage capacitor domain within the OLED device according to another embodiment of the present disclosure.

Referring to FIG. 12, the OLED device of the present disclosure provides a storage capacitor domain within the pixel region. As shown in FIG. 6F, the storage capacitor Cst has a structure of including the first through fifth storage electrodes 401, 502 and 403 through 405 which are sequentially stacked on the substrate 300.

The first and second gate insulation films 302 and 303, the interlayer insulation film 307 and the passivation film 308 are interposed between the first through fifth storage electrodes 401, 502, and 403 through 205.

In accordance therewith, a first sub storage capacitor C1 is formed between the first and second storage electrodes 401 and 502. Also, a second sub storage capacitor C2 is formed between the second and third storage electrodes 502 and 403. Moreover, a third sub storage capacitor C3 is formed between the third and fourth storage electrodes 403 and 404. Furthermore, a fourth sub storage capacitor C4 is formed between the fourth and fifth storage electrodes 404 and 405.

In this manner, the first through fourth sub storage capacitors C1 through C4 are connected parallel to one another in equivalent circuit. As such, the storage capacitance Cst of the OLED device according to the present disclosure can become the sum of the first through fourth sub storage capacitors C1 through C4. Also, although the second storage electrode 502 is formed from the oxide semiconductor, the second storage electrode 502 can have enhanced conductivity through the light irradiation or the plasma treatment. Therefore, the storage capacitor of the present disclosure can stably secure a large storage capacitance.

As such, although the storage capacitor domain of the present disclosure is defined in the same area as that of the related art, the storage capacitor Cst of the present disclosure can obtain a large storage capacitance corresponding to the sum of four sub storage capacitors. In accordance therewith, a charge property of the data signal can be enhanced.

Moreover, although the storage capacitor domain of the OLED device according to the present disclosure is defined narrower than that of the related art, a large storage capacitor Cst can be obtained. In accordance therewith, the organic light emitting diode domain can expand. In other words, the aperture ratio of the organic light emitting diode domain can become larger.

Furthermore, the OLED device of the present disclosure performs the light irradiation process or the plasma treatment process for the oxide semiconductor pattern, which is used to form an electrode of the storage capacitor, enhances conductivity of the electrode. Therefore, the storage capacitor can stably secure a desired capacitance.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device comprising:
   a substrate; and
   scan, data, and power lines crossing one another and arranged to define a plurality of pixel regions, each pixel region comprising:
      a switching thin film transistor disposed at an intersection of a corresponding scan line and a corresponding data line;
      an organic light emitting diode disposed in the pixel region;
      a driving thin film transistor disposed between a corresponding power line and the organic light emitting diode, the driving thin film transistor including a first gate electrode and a second gate electrode; and
      a storage capacitor disposed adjacent to the organic light emitting diode and configured to charge a data signal which is applied from the corresponding data line,
   wherein the storage capacitor includes a plurality of sub storage capacitors in which a plurality of storage electrodes are stacked alternately with one another, the plurality of sub storage capacitors comprising a first sub storage capacitor and a second sub storage capacitor positioned further from the substrate than the first sub storage capacitor,
   wherein at least one of the plurality of storage electrodes is of a same material as the first gate electrode of the driving thin film transistor and is in the same layer as the first gate electrode of the driving thin film transistor, and
   wherein at least another one of the plurality of storage electrodes is of a same material as the second gate electrode of the driving thin film transistor and is in the same layer as the second gate electrode of the driving thin film transistor.

2. The organic light emitting diode display device of claim 1, further comprising a sensing thin film transistor connected between the driving thin film transistor and the organic light emitting diode, the sensing thin film transistor configured to control a ground state of the driving thin film transistor.

3. The organic light emitting diode display device of claim 1, wherein the switching thin film transistor and the driving thin film transistor each includes a channel layer formed from an oxide semiconductor layer.

4. The organic light emitting diode display device of claim 1, wherein the driving thin film transistor comprises a channel layer disposed in between the first gate electrode and the second gate electrode.

5. The organic light emitting diode display device of claim 1, wherein a lower electrode of the first sub storage capacitor is positioned closer to the substrate than a lower electrode of the second sub storage capacitor.

6. The organic light emitting diode display device of claim 1, wherein the plurality of storage electrodes are stacked alternately with one another in a direction leading away from the substrate.

7. An organic light emitting diode display device comprising:
   a substrate; and
   scan, data, and power lines crossing one another and arranged to define a plurality of pixel regions, each pixel region comprising:
      a switching thin film transistor disposed at an intersection of a corresponding scan line and a corresponding data line;
      an organic light emitting diode disposed in the pixel region;
      a driving thin film transistor disposed between a corresponding power line and the organic light emitting diode; and
      a storage capacitor disposed adjacent to the organic light emitting diode and configured to charge a data signal which is applied from the corresponding data line,
   wherein the storage capacitor includes a plurality of sub storage capacitors in which a plurality of storage electrodes are stacked alternately with one another, wherein the plurality of storage electrodes includes first, second, third, fourth, and fifth storage electrodes, wherein the plurality of sub storage capacitors includes a first sub storage capacitor between the first and the second electrodes, a second sub storage capacitor between the second and the third electrodes, a third sub storage capacitor between the third and the fourth storage electrodes, and a fourth sub storage capacitor between the fourth and the fifth storage electrodes, and wherein the second sub storage capacitor is positioned further from the substrate than the first sub storage capacitor.

8. The organic light emitting diode display device of claim 7, wherein
   the first, the third, and the fifth storage electrodes are electrically connected to one another;
   the second and the fourth storage electrodes are electrically connected to each other; and
   the first, the second, the third, and the fourth sub storage capacitors are connected in parallel to one another.

9. The organic light emitting diode display device of claim 7, wherein the first storage electrode is of a same material as a first gate electrode of the driving thin film transistor and is co-planar with the first gate electrode of the driving thin film transistor.

10. The organic light emitting diode display device of claim 9, wherein the third storage electrode is of a same material as a second gate electrode of the driving thin film transistor and is co-planar with the second gate electrode of the driving thin film transistor.

11. The organic light emitting diode display device of claim 7, wherein the fifth storage electrode is of a same material as a cathode electrode or an anode electrode of the organic light emitting diode and is co-planar with the cathode electrode or the anode electrode of the organic light emitting diode.

12. The organic light emitting diode display device of claim 8, wherein
   the first, the third, and the fifth storage electrodes are electrically connected through a first contact hole; and
   the second and the fourth storage electrodes are electrically connected through a second contact hole.

* * * * *